(12) United States Patent
Ko

(10) Patent No.: US 8,723,844 B2
(45) Date of Patent: May 13, 2014

(54) DISPLAY PANEL

(75) Inventor: Gwang-Bum Ko, Asan-si (KR)

(73) Assignee: Samsung Display Co., Ltd. (KR)

( * ) Notice: Subject to any disclaimer, the term of this patent is extended or adjusted under 35 U.S.C. 154(b) by 224 days.

(21) Appl. No.: 12/958,180

(22) Filed: Dec. 1, 2010

(65) Prior Publication Data

US 2011/0148853 A1 Jun. 23, 2011

(30) Foreign Application Priority Data

Dec. 18, 2009 (KR) ........................ 10-2009-0126578

(51) Int. Cl.
G06F 3/041 (2006.01)

(52) U.S. Cl.
USPC ........................................... 345/204

(58) Field of Classification Search
USPC ................... 345/215, 204, 100, 208, 210; 377/64–80

See application file for complete search history.

(56) References Cited

U.S. PATENT DOCUMENTS

| 7,120,221 | B2 | 10/2006 | Moon | |
|---|---|---|---|---|
| 2003/0012330 | A1* | 1/2003 | Osame | 377/2 |
| 2005/0134545 | A1* | 6/2005 | Jang et al. | 345/100 |
| 2006/0082535 | A1 | 4/2006 | Osame et al. | |
| 2007/0296681 | A1* | 12/2007 | Kim et al. | 345/100 |
| 2008/0074379 | A1* | 3/2008 | Kim et al. | 345/99 |
| 2008/0273004 | A1 | 11/2008 | Osame et al. | |
| 2009/0033642 | A1* | 2/2009 | Chiang et al. | 345/204 |
| 2009/0040203 | A1 | 2/2009 | Kim et al. | |
| 2009/0122951 | A1* | 5/2009 | Tobita | 377/68 |
| 2009/0189679 | A1* | 7/2009 | Lee et al. | 327/436 |
| 2009/0303211 | A1* | 12/2009 | Hu | 345/204 |

FOREIGN PATENT DOCUMENTS

| JP | 2003-273228 A | 9/2003 |
|---|---|---|
| JP | 2006-031912 A | 2/2006 |
| JP | 2007-207411 | 8/2007 |
| JP | 2008-217902 A | 9/2008 |
| KR | 1020070003564 A | 1/2007 |
| KR | 1020070118448 A | 12/2007 |
| KR | 1020080044458 A | 5/2008 |
| KR | 1020080057601 A | 6/2008 |
| KR | 1020080062132 A | 7/2008 |

OTHER PUBLICATIONS

EP Search Report corresponding to EP application No. 10194763.8, May 20, 2011, 7 pages.

* cited by examiner

*Primary Examiner* — Srilakshmi K Kumar
*Assistant Examiner* — Damon Treitler
(74) *Attorney, Agent, or Firm* — Innovation Counsel LLP

(57) ABSTRACT

Noise is reduced at a so-called Q-node and a so-called A-node of shift registers in a gate lines driving block of a scan driven display system so that the display system can be safely operated even at elevated temperatures. A variety of techniques may be used to reduce the noise. A first of the techniques applies charging pulses to the A-node at a rate faster than just once every 2H durations, where 1H is the duration of a single row drive. More specifically, a plurality of so-called inverter circuits, rather than just one are included in each shift register stage and the inverters are operated in synchronism with out of phase clock signals so as to thereby increase the rate at which the A-node is pulsed to a high voltage level. A second technique charges up the Q-node in multiple steps. A third technique pulls down the carry line at times when it does not need to go high. A fourth technique combines one or more of the first through third techniques.

16 Claims, 13 Drawing Sheets

ABILITY PANEL

CROSS-REFERENCE TO RELATED APPLICATION

This application claims priority to and the benefit of Korean Patent Application No. 10-2009-0126578 filed in the Korean Intellectual Property Office on Dec. 18, 2009, the entire contents of which application are incorporated herein by reference.

BACKGROUND (a) Field of Disclosure

The present disclosure of invention relates to a display device, and more particularly, to a display device having a gate driver monolithically integrated as part of a substrate of the display device.

(b) Description of Related Technology

Among image display devices, a liquid crystal display (LCD) is one of the flat panel displays that have gained wide usage. The typical LCD includes two display substrates in which there are provided field generating electrodes such as pixel electrodes and a common electrode, etc. The two display substrates are typically provided in spaced apart facing relation and a liquid crystal material layer is interposed therebetween. Electronic circuit portions of the liquid crystal display apply voltages to the electric field generating electrodes to thereby generate electric fields extending through the liquid crystal material layer. As a result, an orientation direction of liquid crystal molecules of the liquid crystal material layer is determined and polarization of incident light is controlled. This ultimately results in display of a desired image. Other types of falt panel display devices include an organic light emitting device (OLED), a plasma display device, and an electrophoretic display, etc. in addition to the liquid crystal display.

The typically display device includes a gate lines driver circuit and a data lines driver circuit. In one variation, the gate lines driver circuit is monolithically integrated as part of a lower or TFT array substrate along with a plurality of gate lines, data lines, thin film transistors, etc. Since the functionality of the so-integrated gate lines driver is provided on board the TFT array substrate, it is no longer required to provide and mount an additional, separate gate lines driving chip and thus it is possible to save on manufacturing costs and increase device reliability. However, the monolithically integrated gate lines driver has drawbacks. One of the problems is that electronic characteristics of a semiconductive portion (and in particular, an amorphous semiconductor material, e.g., Si(a)) of the thin film transistor change according to temperature and is susceptible to noise problems at higher temperatures. As a result, a gate drive voltage signal that is output at high temperatures by conventional, monolithically integrated gate lines drivers does not have a desired waveform (e.g., an ideal square wave shape free of noise) and instead, interfering noise spikes may occur.

The above information disclosed in this Background section is only for enhancement of understanding of the technology and therefore it may contain information that does not form part of the prior art that is already known to persons of ordinary skill in the pertinent art.

SUMMARY

The circuit designs presented in the present disclosure have been made in an effort to provide a display device having advantage of outputting a gate line driving voltage having a predetermined waveform from a monolithically integrated gate lines driver wherein noise can be suppressed even though the temperature is raised. More specifically, so-called gate line pull-down circuits are provided and controlled so as to keep the gate lines substantially free of noise except in a short time duration when the gate line needs to be allowed to be driven high and optionally one scan period (1H) thereafter. The gate line pull-down circuits are controlled by a so-called A-node and various techniques are disclosed herein for better controlling the A-node and thus ultimately better controlling (suppressing) noise on the gate lines during times when it is desirable to hold them at logic low ($V_{Goff}$). An exemplary embodiment in accordance with the present disclosure provides a display device with a TFT array substrate that includes a display area that includes gate lines and data lines; and a gate lines driver block that is connected to first ends of the gate lines, where the gate lines driver block includes a plurality of stages, and is monolithically integrated on the substrate, wherein each stage includes a first inverter that outputs A-node charging pulses in synchronism with a first clock signal and a second inverter that outputs A-node charging pulses in synchronism with a second clock signal having a phase different from the first clock signal, and where the A-node has be low in order for the stage to output a gate turn on voltage level, VGon. The stage may be primed into an enabled state where it can output the gate turn on voltage level, VGon by first receiving a high transfer signal as an enabling token signal from the previous stage in the cascaded chain of stages. The stage may further include an input unit, a pull-down driving unit, an output unit, and a transfer signal generating unit. The output unit and the transfer signal generating unit may respectively output a gate turn on voltage level, VGon and a high transfer signal, respectively depending on a voltage at a first node. The pull-down driving unit may change the voltage at the first node or the gate voltage to the low voltage. The output of the first inverter and the output of the second inverter may be connected to each other at a second point (to pump charge the A-node). The first inverter may apply a high signal to the second node when a high level is applied by a first clock signal. The second inverter may apply a high signal to the second node when a high level is applied by a second, different phased clock signal. The voltage at the second node may be at a low level during only a timing section when the gate turn on voltage level, VGon is to be output and also in a next 1H timing section. The voltage at the first node of the current stage may be changed to the low voltage depending on the voltage at the second node of the previous stage. The transfer signal of the current stage may be changed to the low voltage depending on the voltage at the second node of the previous stage.

Other aspects will become clearer from the below detailed description.

DETAILED DESCRIPTION

Figure 1:
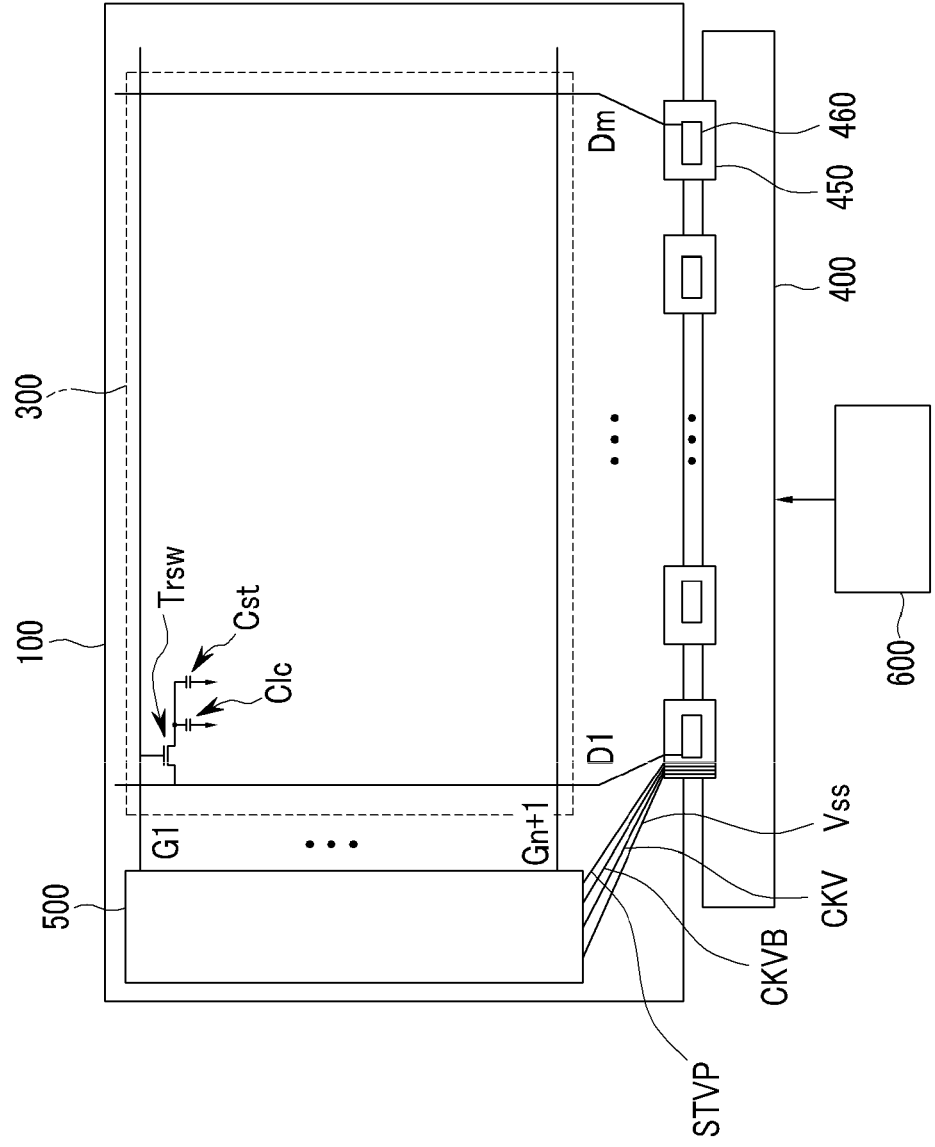
FIG. 1 is a plan schematic view of a display device according to an exemplary embodiment in accordance with the present disclosure.

The present teachings will be described more fully hereinafter with reference to the accompanying drawings, in which exemplary embodiments are shown. As those skilled in the art would realize after appreciating this disclosure, the described embodiments may be modified in various different ways, all without departing from the spirit or scope of the present teachings.

In the drawings, the thickness of layers, films, panels, regions, etc., may be exaggerated for clarity. Like reference numerals generally designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a display device according to an exemplary embodiment will be described in detail with reference to FIG. 1.

FIG. 1 is a plan view of a display device according to an exemplary embodiment.

Referring to FIG. 1, the display device comprises a TFT substrate 100 that includes a display area (DA) 300 in which desired images are displayed. A monolithically integrated gate driver 500 is disposed outside the display area (DA) 300 and is connected to apply controlling gate voltage signals to gate lines (Gn) of the display area 300. Meanwhile, data lines (Dm) of the display area 300 receive data voltage signals from one or more, off-substrate, data driver integrated circuits, such as IC 460 that are formed on flexible printed circuit films 450 (FPC's) attached to the TFT substrate 100. Meanwhile, the gate driver circuit 500 and the data driver IC's 460 are controlled by a signal controller circuit 600 that, among other functions, provides synchronizing clock signals to various parts of the circuitry (where the synchronizing clock signals may include a CKV clock and its inverse, CKVB as shall be detailed below. In one embodiment, a printed circuit board 400 (PCB) is provided outside the flexible printed circuit film 450 to transmit control and/or data signals from the signal controller 600 to the data driver IC's 460 and to the gate driver circuit 500. As already mentioned in part, in one embodiment, the signals provided from the signal controller 600 may include a first clock signal CKV, a second (e.g., inverted) clock signal CKVB, a scan starting signal STVP, and so on. In one embodiment, the signal controller 600 also may provide specific reference voltages, including a Vss reference voltage that is approximately equal to a gate turn off voltage level, VGoff of the system. Those skilled in the art will appreciate from the below that the first and second clock signals, CKV and CKVB, may be used to provide a gate turn on voltage level, VGon of the system.

The display area 300 includes a plurality of image forming cells, where each includes a respective thin film transistor Trsw, a liquid crystal capacitor Clc (formed by a respective pixel-electrode), a charge maintaining or storing capacitor Cst, etc. in the case where the display is of the liquid crystal panel type. FIG. 1 shows the liquid crystal panel by way of example. Meanwhile, the present teachings may also be applied to an organic light emitting display panel (OLED) which includes thin film transistors and to an organic light emitting diodes type of display and to other display devices that include semiconductive elements such as thin film transistors, etc., formed in a light passing display area such as 300. Hereinafter, the liquid crystal panel will be described by way of example. In the LCD embodiment, the aforementioned gate turn off voltage level, VGoff, is to be maintained on a gate electrode (control electrode) of the cell switching device, Trsw, when the cell is in a charge storing/retaining mode and the aforementioned gate turn on voltage level, VGon, is to be temporarily applied to gate electrode (control electrode) of Trsw when the corresponding cell is in a mode of acquiring a new, image-defining charge level (a new data voltage). However, because many currents flow through the system during edges of its synchronizing clock signals, CKV and CKVB (see briefly FIG. 4), noise spikes may be acquired on the relatively long gate lines of the system (they may act like antennas) and thus it becomes desirable to suppress the noise spikes for as long as possible. It will be seen in the details below that one way of suppressing the noise spikes is by using pull-down circuits to keep the gate lines pulled low (to Vss) for as long as possible. It will be further seen in the details below that another way to suppress the noise spikes is by distributing the current sinking or pull-down functions so that pulled down current is distributed through a number of different current sinking lines rather than through a single wire.

Returning now to the broader system description provided by FIG. 1, it is seen that the display area 300 includes a plurality of relatively long and operative gate lines denoted as G1-Gn and distributed across the display area 300. It is also seen that the display area 300 includes a plurality of operative data lines denoted as D1-Dm which are orthogonally distributed across the display area 300. So-called dummy gate lines such as G(n+1) may be further provided. The plurality of gate lines G1-Gn and the plurality of data line D1-Dm are typically formed as parallel sets that cross orthogonally with one another but are isolated from each other.

Each picture element control unit (also known as a pixel unit, PX for short) includes a respective thin film switching transistor Trsw and a liquid crystal capacitor Clc that is selectively charged through the thin film transistor Trsw when the switching transistor Trsw is turned on. Each pixel unit PX may additionally include a charge maintaining capacitor Cst that is structured to help the pixel unit PX retain its charge during periods when the switching transistor Trsw is supposed to be turned off. A control electrode (also known as gate electrode) of the thin film transistor Trsw is connected to one of the gate lines, an input electrode (also known as source electrode) of the thin film transistor Trsw is connected to one of the data lines, and an output electrode (also known as drain electrode) of the thin film transistor Trsw is connected to one capacitor plate portion (also known as pixel electrode) of the liquid crystal capacitor Clc. The output electrode is also connected to one terminal of the charge maintaining capacitor Cst. The other plate or terminal of the liquid crystal capacitor Clc is formed by a portion of a common electrode typically provided in an opposed substrate. The other terminal of the charge maintaining capacitor Cst is supplied with a maintaining voltage supplied from the signal controller 600.

During operation, the plurality of data lines D1-Dm are provided with serial sets of respective analog drive voltages (a.k.a. data voltages) from corresponding ones of the data driver IC's 460 and the plurality of gate lines G1-Gn are provided with gate control voltage signals from the gate drivers section 500. Typically, only one gate line is turned on at a time during a frame rendering period and that gate line is turned off before a next gate line is sequentially turned on. Thus a row-by-row scanning operation is effected to thereby serially load the data voltages into successive rows of pixel units PX.

The data driver IC's 460 may be disposed along upper and lower side edges of the TFT substrate 100 and connected to the closely spaced apart data lines D1-Dm by way of line extensions that extend in the generally vertical direction, where in the exemplary embodiment illustrated in FIG. 1, the data driver IC's 460 are disposed only along the lower side edge of the TFT substrate 100.

The gate lines driver circuit 500 generates gate line driving voltage signals (having gate-on and gate-off voltage levels) in response to and in synchronism with the clock signals CKB and CKVB, and in response to initiation by the scan start signal, STVP. Reference voltage levels such as the low voltage, Vss, where the latter corresponds to the gate-off voltage level ($V_{Goff}$) are applied to the gate lines G1 to Gn during various timing periods of their respective operations.

The clock signals CKV and CKVB, the scan start signal STVP, and the voltage Vss corresponding to the gate-off voltage applied to the gate driver 500 are applied to the gate driver 500 through one of the flexible printed circuit films 450 positioned for example at the outermost side of the TFT substrate 100 as shown in FIG. 1. The signal is transmitted to the flexible printed circuit film 450 through the printed circuit board 400 from outside or the signal controller 600.

The structure of the TFT array substrate 100 of the display device was described above. In addition there is often provided, a common electrode substrate (not shown) whose structure will not be discussed in detail herein. The aforementioned common electrode is typically mounted on the common electrode substrate and a liquid crystal material layer is interposed between the TFT array substrate 100 and the common electrode substrate (not shown).

Hereinafter, the gate lines driver block 500 and the gate lines G1-Gn that are more related to the present disclosure will be mainly described.

Figure 2:
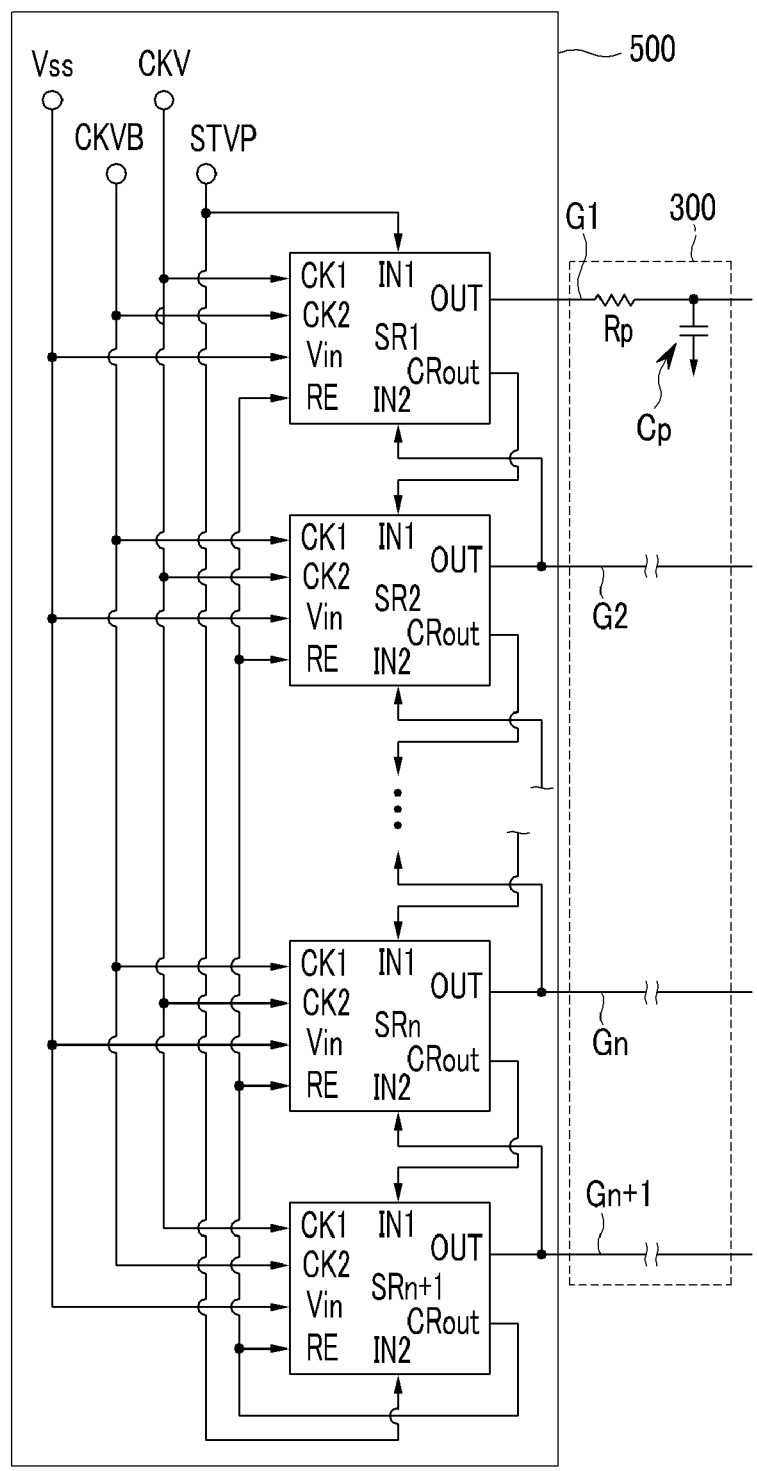
FIG. 2 is a block diagram showing in more detail a gate lines driver block and a corresponding plurality of gate lines driven by that block.

FIG. 2 is a block diagram showing in more detail the gate lines drivers section or block 500 and the gate lines (as RC equivalent circuits) in area 300 of FIG. 1.

The gate drivers section 500 includes a plurality of token shifting stages: SR1-SRn+1 that are connected to each other in a cascade form. Each stage SR1-SRn+1 includes two input terminals, IN1 and IN2 (one for receiving a control signal from the previous stage if any and the other for receiving a control signal from the next stage), two clock input terminals, CK1 and CK2 for respectively receiving one or the other of the clock and inverted clock signals, CKV and CKVBar), a voltage input terminal Vin to which is applied the low reference voltage level Vss approximating to the gate-off voltage, a reset terminal RE, a stage output terminal OUT, and a carry transfer signal output terminal CRout. From time to time herein, a given stage of block 500 will be referenced as stage SR(k) and in that case, its respective terminals may be referenced with the same stage suffix, for example, OUT(k), IN1(*k*) and so forth.

Firstly here, it is noted that the respective first input terminal IN1 of substantially each stage is connected to the transfer signal output terminal CRout of a previous stage to thereby receive the transfer signal CR (also known as the carry signal or the token signal) of the previous stage. Because it has no previous stage, the first (top) stage, SR(1) receives the scan starting signal STVP at its respective first input terminal IN1(1).

The second input terminal IN2 of each k-th stage (SR(k)) is connected to the output terminal OUT of the next stage SR(k+1) to receive the gate voltage G(k+1) of the next stage, SR(k+1). Herein, in the case where there is an n+1-th stage, SR(n+1) (a dummy line driving stage) that is formed last in the cascaded chain, it is supplied with the scan starting signal STVP to a second input terminal IN2 thereof since there is no next stage.

The first clock terminals CK1 of the odd numbered stages (SR1, SR3, etc.) are supplied with the first (noninverted) clock CKV and the second clock terminal CK2 of the odd numbered stages is supplied with the second (inverted) clock CKVB. Meanwhile, the first clock terminal CK1 of the even numbered stages (SR2, SR4, etc.) are supplied with the second clock CKVB and the respective second clock terminals CK2 thereof are supplied with the first clock CKV, such that the phase of the clock input to the same terminal is opposite to each other, as compared with the odd numbered stages.

The voltage input terminal Vin is supplied with the low voltage Vss which level approximates the gate-turn-off voltage ($V_{Goff}$) applied to the TFT transistors of the display area when the TFT transistors are intended to be turned off. The reset terminal (RE) is connected to the transfer signal output terminal CRout of the dummy stage SRn+1 that is positioned last in the shift register chain such that when CRout(n+1) goes high, all the stages (including SR(n+1)) will be reset, whereupon CRout(n+1) then goes low and the chain of shift registers is ready for receipt of a next scan operation initiating pulse on the STVP line.

Herein, the dummy stage SRn+1 is a stage that generates and outputs a dummy gate voltage signal, which unlike the other stages SR1-SRn, is not applied to an active display row in the display area 300. In other words, the gate voltages output from the other stages SR1-SRn are transferred through their respective gate lines to activatable rows of the display area. The data voltages then present on the data lines are applied to the pixel units of the then activated row (turned on row) so as to thereby form the image to be displayed by way of a row-by-row scanning method. However, the dummy stage SRn+1 may not be connected to a used gate line. And even though dummy stage SRn+1 is connected to a respective gate line Gn+1, that gate line may be connected to dummy pixel units (not shown) that do not display part of the on-screen image. In other words, the dummy gate line is not used to display images.

The operation of the gate driver 500 will be now described in yet more detail.

First, the first stage SR1 is supplied with the first and second clock signals, CKV and CKVB, respectively through the first clock input terminal CK1 and the second clock input terminal CK2 from an outside circuit (e.g., 600, not shown).

The scan starting signal STVP is applied through the first input terminal IN1 of SR1 to thereby initiate the subsequent chain of synchronous events. At the same time, the voltage input terminal Vin is supplied with the low voltage Vss approximating the gate-off voltage. The IN2 terminal at this time receives the gate off voltage (voltage output from an out terminal) provided from the second stage SR2. The logic high level on the CK1 line at this time acts as a power source for providing the gate turn-on voltage level ($VG_{on}$) and the above set of priming events allows the first stage, SR1 to output the gate turn-on voltage ($VG_{on}$) to the first gate line G1 through its respective output terminal OUT(1). At the same time as OUT(1) goes high, CRout(1) also goes high and thus it outputs a logic true transfer signal CR, which is transferred to the first input terminal IN1 of the next shift register, in this case, the second stage SR2.

The second stage SR2 receives the first and second clock signals CKV and CKVB respectively provided through the second and first clock input terminals CK2 and CK1 from the outside, respectively. Note that because CKVB generally does not go high until CKV is going or has gone low, that the second stage output to G2 will not go high until the first stage output to G1 has gone low and has thus latched the then present data voltages on the data lines (DL) into the pixel units of the first row (G1). Since the second stage SR2 is at this time receiving the high transfer signal CR from the first stage SR1, it is primed to drive its gate line, G2, high and to output a high transfer signal CR from CRout2, which carry or token signal is then transferred to the first input terminal IN1 of the third stage SR3.

In the above-mentioned manner, the n-th stage, SRn receives the first and second clock signals CKV and CKVB provided from the outside through the first and second clock input terminals CK1 and CK2 (or vise versa for even numbered stages), and the passed-along token or transfer signal CR from the n–1 stage SRn–1 through the first input terminal IN1, and the low voltage Vss through its terminal Vin, and the output gate voltage provided from the n–1 stage SRn–1 through the second input terminal IN2, respectively, to thereby be enabled to output the gate turn-on voltage ($V_{Gon}$) of the n-th gate line (Gn) when its turn arrives and to thereby be enabled to output the high transfer signal CR at that time, where the latter signal is transferred to the first input terminal IN1 of the n+1 dummy stage SRn+1.

The overall structure of the gate drivers 500 has been described with reference to FIG. 2. Herebelow, the structure of a specific gate driver circuit SRk that is connected to a respective one gate line (Gk) will be described in more detail with reference to FIG. 3.

Figure 3:
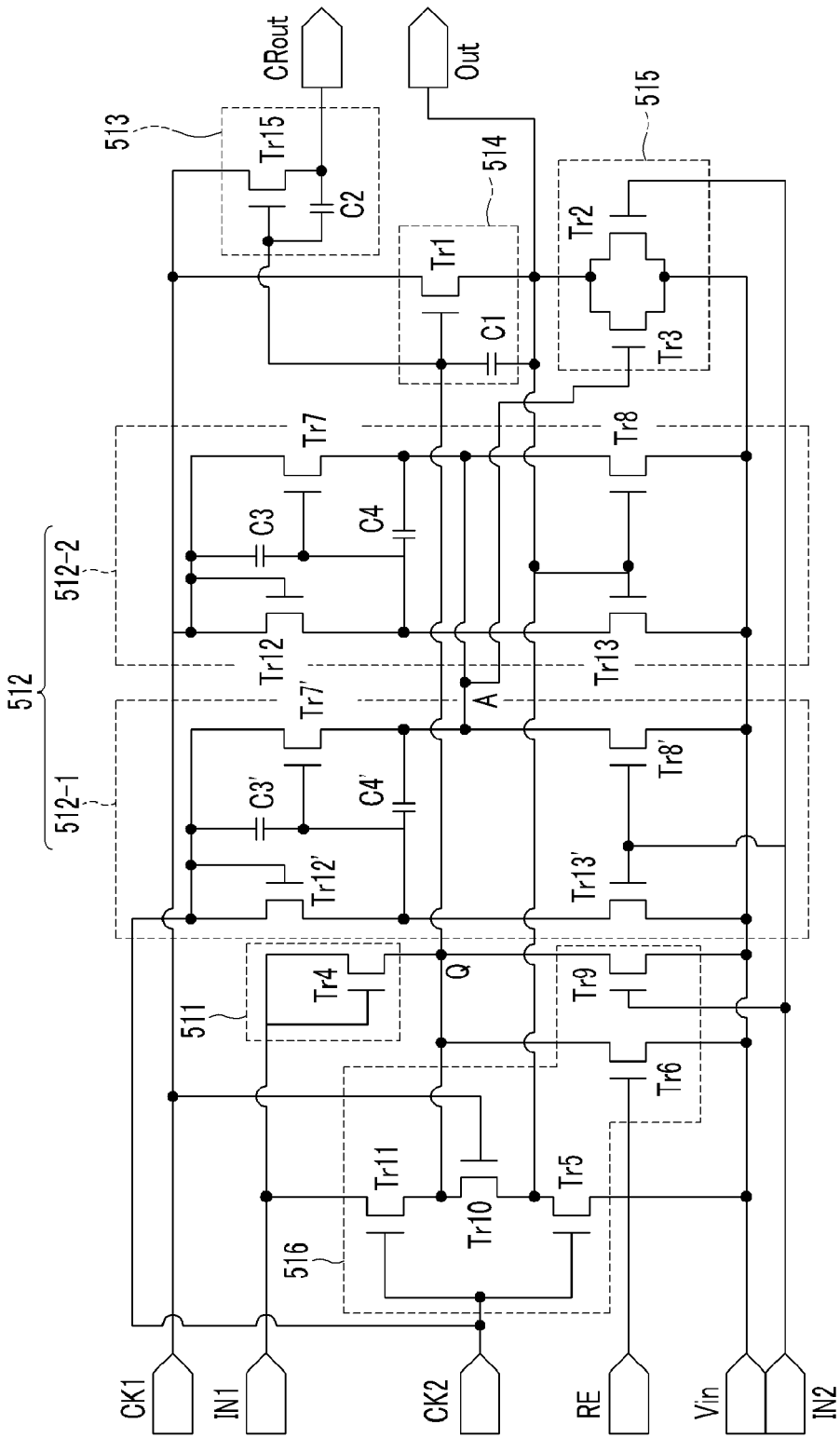
FIG. 3 is an enlarged circuit diagram in accordance with one embodiment of one stage SR(k) that may be repeatedly provided in the gate lines driver block of FIG. 2.

FIG. 3 is an enlarged circuit diagram of one stage SRk that can be used in the system of FIG. 2.

Referring to FIG. 3, each stage SRk of the gate driver 500 according to a first exemplary embodiment includes a token inputting unit 511 (e.g., diode connected transistor Tr4), a clock pulses inversion suppression unit 512 (also known as the "inverter unit" 512 for short), a token or transfer signal generating unit 513, a gate line outputting (or line pull up) unit 514, and gate line pull-down driving units 515 and 516.

In the illustrated embodiment, the input unit 511 consists of one diode-connected NMOS transistor (fourth transistor Tr4). The purpose of this circuit 511 is to pass the token or baton into capacitance C1 just before a next CK1 pulse arrives wherein the OUT(k) line will be driven high (to the gate turn on voltage level, VGon). In terms of more detail, an input electrode and a control electrode of the fourth transistor Tr4 are commonly connected (diode-connected) to the first input terminal IN1 and an output electrode is connected to a Q-node (also referred to as first node). The Q-node may be considered synonymous with the charge state of capacitance C1. If C1 is charged to a voltage above the threshold of Tr1, then Tr1 is enable to pass a gate turn on voltage level, VGon from the CK1 line to the OUT terminal. More specifically, when a high-going voltage pulse is supplied to the first input terminal IN1 (receives the carry or token or baton signal from the previous stage), the token inputting unit 511 performs the role of transferring that high voltage (previous stage carry is true) to the Q node to thereby charge up C1 and the gate of transistor Tr1 and to thus ready TR1 for arrival of a going-high, CK1 pulse during a time period when the current stage SRk is intended to output a gate turn on voltage level, VGon through its OUT terminal.

The inverter unit 512 includes a first inverter subunit 512-1 and a second inverter subunit 512-2.

The first inverter 512-1 includes four transistors (referenced here as a 7'-th transistor Tr7', an 8'-th transistor Tr8', a 12'-th transistor Tr12', and a 13'-th transistor Tr13' and two capacitors (a 3'-th capacitor C3' and a 4'-th capacitor C4'). First, a control electrode and an input electrode of the 12'-th transistor Tr12' are commonly connected (diode connected) to receive the CK2 clock signal. An output electrode of the 12'-th transistor Tr12' is connected to a gate of Tr7'. The output electrode of Tr12' is also connected to an input electrode of the 13'-th transistor Tr13'. A control electrode of the 13'-th transistor Tr13' is connected to the second input terminal IN2 to receive the gate voltage of the next stage and an output terminal of the 13'-th transistor Tr13' is connected to the voltage input terminal Vin to receive the low voltage Vss. In addition, an input electrode of the 7'-th transistor Tr7' is also connected to the CK2 line. An output electrode of the 7'-th transistor Tr7' is connected with the gate of Tr3 by way of the so-called A-node. The output electrode of Tr7' is also connected to an input electrode of the 8'-th transistor Tr8'. A control electrode of the 8'-th transistor Tr8' is connected to the second input terminal IN2 and an output electrode of the 8'-th transistor Tr8' is connected to the voltage input terminal Vin. Meanwhile, the 3'-rd third capacitor C3 is formed between a control electrode and the input electrode of the 7'-th transistor Tr7' and the 4'-th capacitor C4' is formed between the control electrode and the output electrode of the 7'-th transistor Tr7'. The 3'-rd capacitor C3' and the 4'-th capacitor C4' may be or may include intentional parasitic capacitors that are integrally formed as part of the structure of Tr7' and Tr12'.

In the first inverter 512-1, when a high signal is applied to the second clock terminal CK2 (and provided that IN2 is low at that time), the high signal is applied through the diode-connected 12'-th transistor Tr12' and the high signal is applied for charging up the control electrode of the 7'-th transistor Tr7', such that the 7'-th transistor Tr7' is turned on and as a result, the turned-on Tr7' transistor couples the high CK2 level signal to the A-node and also to the gate of Tr3 by way of the A-node. (As will become more apparent from later descriptions, when the A-node is high, pull down circuit 515 is activated to sink current out of the associated gate line (G(k)) and towards the Vin terminal.) Transistor Tr7' is also tied to the input electrode of the 8'-th transistor Tr8'. If Tr8' happens to be turned on (because IN2 is high), then Tr7' will be prevented from charging up the A-node. In other words, later on, when the gate-on voltage of the next stage is applied to the second input terminal IN2, the 13'-th transistor Tr13' and the 8'-th transistor Tr8' are turned on, such that the high signal supplied to the A-node is discharged (inverted) to the low voltage Vss. The A-node is discharged (inverted) only during the scan period when OUT(k) is permitted to go high; and also in one additional period as shall be seen in FIG. 4. At all other times, the first inverter 512-1 is trying to charge the A-node high in response to each rising edge of the CK2 clock signal. Aside from being activated by the A-node being pulsed to high with each rising edge of the CK2 clock signal, pull down circuit 515 is also activated when IN2 goes high and Tr2 is thus turned on, as will be described later below.

Meanwhile, the second inverter 512-2 similarly includes four transistors (a 7-th transistor Tr7, an 8-th transistor Tr8, a 12-th transistor Tr12, and a 13-th transistor Tr13 and two capacitors (a 3-th capacitor C3 and a 4-th capacitor C4). As is the case with its prime-denoted counterpart Tr12', a control electrode and an input electrode of the diode-connected 12-th transistor Tr12 are commonly connected to receive the CK1 clock signal (as opposed to the CK2 signal received by its prime-denoted counterpart Tr12'). An output electrode of the 12-th transistor Tr12 is connected to an input electrode of the 13-th transistor Tr13. A control electrode of the 13-th transistor Tr13 receives the gate voltage of the current stage and an output electrode of the 13-th transistor Tr13 is connected to the voltage input terminal Vin to receive the low voltage Vss. In addition, an input electrode of the 7-th transistor Tr7 is also connected with the output electrode of the 12-th transistor Tr12, and the input electrode receives the CK1 clock signal. An output electrode of Tr7 is connected with an input electrode of the 8-th transistor Tr8. A control electrode of the 8-th transistor Tr18 receives the gate voltage of the current stage and an output electrode of the 8-th transistor Tr8 is connected to the voltage input terminal Vin. Meanwhile, the 3-rd third capacitor C3 is formed between a control electrode and the input electrode of the 7-th transistor Tr7 and the 4-th capacitor C4 is formed between the control electrode and the output electrode of the 7-th transistor Tr7. The 3-rd capacitor C3 and the 4-th capacitor C4 may be or may include parasitic capacitors that are intentionally formed.

In the second inverter 512-2, when the high signal level is applied to the first clock terminal CK1, that high signal is applied to the gate of Tr7 by way of the diode-connected Tr12. The high CK1 level is also applied to the input electrode of the 13-th transistor Tr13 through the 12-th transistor Tr12. If Tr13 is turned off, then when diode-connected Tr12 charges up the gate of Tr7 above threshold, that 7-th transistor Tr7 is turned on and as a result, a high signal is applied to the A-node as well as to the input electrode of the 8-th transistor Tr8. Thereafter, when the gate-on voltage of the current stage is supplied, the 13-th transistor Tr13 and the 8-th transistor Tr8 are turned on, such that the high signal supplied to the input electrode is changed to the low voltage Vss.

The operations of the first inverter 512-1 and the second inverter 512-2 are similar to each other, but the respective inputted clock signals, CK2 and Ck1, have phases inverted to each other. In other words, the rising edges of CK2 and CK1 are out of phase and therefore the first and second inverter 512-1 and 512-2 try to pump the A-node high at the respective times of the rising edges of CK2 and CK1. Further, for the case of the first inverter 512-1, the initial high signal on the gate of Tr7' (when CK2 goes high and its rising edge is passed through diode-connected Tr12') is changed to the low voltage Vss by the gate-on voltage condition of the next stage being signaled through IN2. On the other hand, in the case of the second inverter 512-2, the initial high signal on the gate of Tr7' (when CK1 goes high and its rising edge is passed through diode-connected Tr12) is changed (inverted back) to the low voltage Vss by the gate-on voltage condition of the current stage (when OUTk goes high and thus turns on Tr13). Therefore, operation times of both inverters are different from each other by a duration of 1H (one horizontal scan period).

Figure 4:
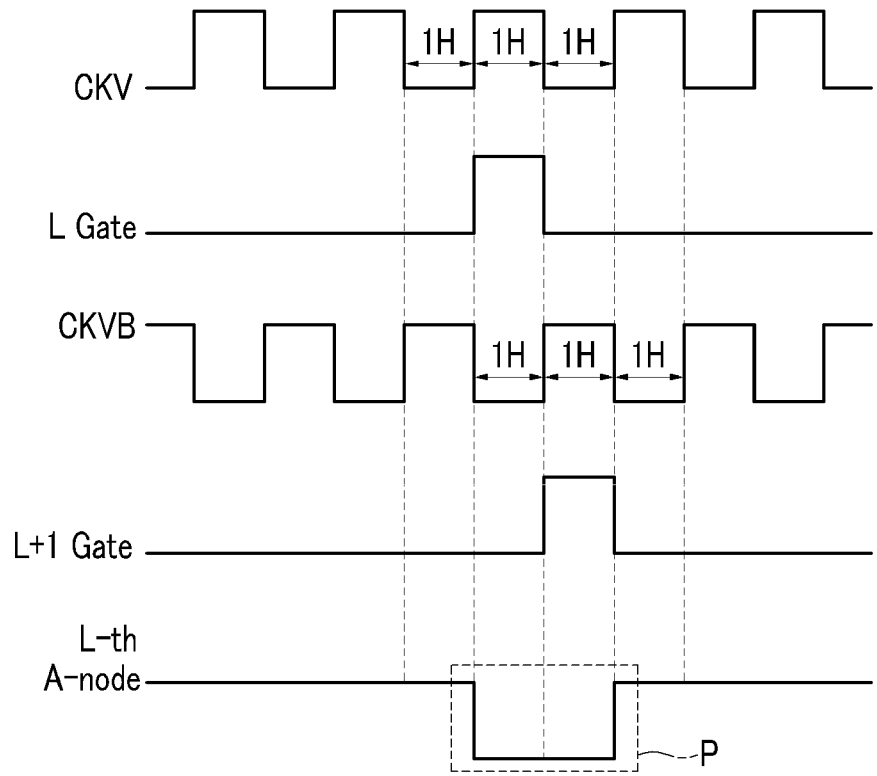
FIG. 4 is a first timing diagram showing a waveform desired on an A-node of the embodiment of FIG. 3 and showing other waveforms that are coincident with the A-node waveform.

The first inverter 512-1 and the second inverter 512-2 are connected to drive the A-node (also referred to as the second node) with their respective charging pulses. (Once again; second inverter 512-2 outputs a high to the A-node at the rising edge of CK1 while the first inverter 512-1 outputs a high to the A-node at the rising edge of CK2.) The A-node is connected with the gate of Tr3. When the 7'-th transistor Tr7' of the first inverter 512-1 outputs its high signal or when the 7-th transistor Tr7 of the second inverter 512-2 outputs its high signal, the A-node couples that high signal pulse to pull-down driving unit 515. This operation will be described later below. Briefly in FIG. 5 it may be seen that the A-node is pulsed to high substantially at the start of every 1H period except for two special scan periods (as will be detailed when period P of FIG. 4 is discussed.)

The transfer signal generating unit 513 includes one transistor (a 15-th transistor Tr15) and one capacitor (a 2-nd capacitor C2). The CK1 clock signal is inputted into an input electrode of the 15-th transistor Tr15. The control electrode of the 15-th transistor Tr15 is connected to an output of the input unit 511, that is, to the Q-node. The Q-node is pre-charged to high in response to the carry CR(k−1) of the previous stage going high and this state being relayed through the IN1 terminal and the diode-connected Tr4 transistor. In the transfer signal generating unit 513, the control electrode and the output electrode of Tr15 are connected to the 2-nd capacitor C2. Herein, the 2-nd capacitor C2 may be or may include an intentionally formed parasitic capacitor. The transfer signal generating unit 512 outputs the carry transfer signal CR to the transfer signal output terminal CRout according to the pre-charged voltage at the Q-node (pre-charged by IN1) and the state of the CK1 clock signal. More specifically, the Q-node is charged high when the previous stage outputs its high CRout (k−1) signal in synchronism with a rising edge of the CK2 signal (CK2 of this k-th stage), but CRout(k) of the current shift register stage does not go high until the next rising edge of CK1 arrives.

The $V_{Gon}$ outputting unit 514 includes one transistor (a 1-st transistor Tr1) and one capacitor (a 1-st capacitor C1). A control electrode of the 1-st transistor Tr1 is connected to the Q-node and an input electrode of the 1-st transistor Tr1 receives the CK1 clock signal. The control electrode and an output electrode are connected to the 1-st capacitor C1 and the output electrode is connected with the gate line. The output unit 513 outputs the gate turn on voltage ($V_{Gon}$) in response to the sequence of events where the Q-node is pre-charged by the carry signal CR(k−1) of the previous stage and then a rising CK1 clock signal arrives to the current stage SR(k).

The pull-down driving units 515 and 516 operate to assure proper outputting of the gate-off voltage ($V_{Goff}$) at all other times (at all times when the Q-node has not been pre-charged by the carry signal CR(k−1) of the previous stage) by repeatedly trying to remove electric charges existing in the current stage SR(k) when rising edges of the CK1 and CK2 signals arrive. The inverters, 512-1 and 512-2 are driving the A-node high in pulsed durations each time either of the rising edges of the CK1 and CK2 signals arrives. This pulse wise activates Tr3 of pull-down driving unit 515 and serves to send a negative going pulse through C1 to thus lower the potential at the Q-node. The momentarily activated Tr3 of pull-down driving unit 515 also tries to momentarily lower the voltage outputted to the gate line G(k) via the OUT terminal. The second pull-down driving unit 516 also tries to pull down the Q-node at appropriate times. More specifically, the pull-down driving units 515 and 516 include seven transistors (a 2-nd transistor Tr2, a 3-rd transistor Tr3, a 5-th transistor Tr5, a 6-th transistor Tr6, a 9-th transistor Tr9 to a 11-th transistor Tr11).

The 5-th transistor Tr5, the 10-th transistor Tr10, and the 11-th transistor Tr11 are connected in series between the first input terminal IN1 into which the transfer signal CR of the previous stage SR(k−1) is inputted and the voltage input terminal Vin into which the low voltage Vss corresponding to the gate-off voltage is inputted. The CK2 clock signal is inputted to control electrodes of the 5-th and 11-th transistors Tr5 and Tr11. On the other hand, the CK1 clock signal is inputted into a control electrode of the 10-th transistor Tr10. Further, the Q-node is connected between the 11-th transistor Tr11 and the 10-th transistor Tr10 and an output electrode of the 1-st transistor Tr1 of the output unit 514, that is, an extension of the G(k) gate line is connected between the 10-th transistor Tr10 and the 5-th transistor Tr5. Since clocks inputted into the first clock terminal CK1 and the second clock terminal CK2 have phases inverted to each other, the 5-th transistor Tr5 and the 11-th transistor Tr11 are turned on at the same time when CK2 goes high. On the other hand, the 10-th transistor Tr10 is turned on in a timing section where the 5-th transistor Tr5 and the 11-th transistor Tr11 are turned off. As a result, when the 5-th transistor Tr5 is turned on while CK2 is high, Tr5 pulls down the voltage of the extension of the G(k) gate line thus causing the gate voltage output terminal Out to be changed to the low voltage Vss. Also, when the 11-th transistor Tr11 is turned on while CK2 is high, if IN1 is low at that time, that pulls the Q-node low. On the other hand, if IN1 is high at that time, the 11-th transistor Tr11 serves to allow the high potential of the first input terminal IN1 to coincide with the potential at the Q-node. The pull down operations allow electric charges to flow out of the Q-node and towards the voltage input terminal Vin to which the low voltage Vss is supplied and towards the IN1 node when the latter is low while dispersing the electric charges remaining in each part.

Meanwhile, a pair of transistors Tr6 and Tr9 are also connected in parallel between the Q-node and the low voltage Vss. Tr6 pulls the Q-node low in response to activation of the reset terminal (RE). On the other hand, Tr9 is responsive to the OUT(k+1) signal of the next stage SR(k+1). Note in FIG. 2 that the transfer signal CR(n+1) of the dummy stage is applied to the reset line RE and thus to the control electrode of the 6-th transistor Tr6 of every stage through its respective reset terminal RE. As a result, when rest is asserted, Tr6 pulls the Q-node low in response thereto. Also, when the gate-on voltage (OUT(k+1)) of the next stage goes high, it causes the 9-th transistor Tr9 to pull the voltage of the Q-node to the low voltage Vss. When the Q-node goes low, Tr1 shuts off so as not to output the gate on voltage any more.

Lastly, in addition to Tr3, transistor Tr2 is provided in pull down unit 515 and made responsive to the gate-on voltage (OUT(k+1)) of the next stage via the IN2 terminal. When the gate-on voltage (OUT(k+1)) of the next stage goes high, it causes Tr2 to turn on and pull the OUT(k) terminal of the output unit 514 to the low-potential level Vss. As already mentioned, control electrode of the 3-rd transistor Tr3 is connected to the A-node driven by the inverters 512. Each time a rising edge of one of the CK1 and CK2 clock signals occurs, the 3-rd transistor Tr3 is momentarily turned on to try to pull OUT(k) low. It is blocked from succeeding in the case where Tr10 is also turned on and OUT(k) is already high, in which case Tr10 causes OUT(k) to remain latched high by driving the Q-node high. The voltage appearing on the A-node will be described in more detail in FIGS. 4 and 5.

As described in FIG. 2, both the first and second clock signals CKV and CKVB are inputted to each stage of the gate driver 500 and the first and second clock signals CKV and CKVB are alternately inputted to the first and second clock terminals CK1 and CK2 for each stage.

The transistors that are formed in the stage SR may all be NMOS transistors.

Hereinafter, a signal waveform of the embodiment of FIG. 3 will be described through reference to FIG. 4.

FIG. 4 is a graph showing waveforms of an A-node voltage and of an output gate terminal G(L) of an L-th gate driver (where L is odd) according to an embodiment of FIG. 3.

First, the first clock signal CKV and the second clock signal CKVB have phases inverted to each other. In addition, the gate-on voltage output by the L-th (the current) stage (herein, L represents an odd number) and the gate-on voltage output by the L+1-th (the next) stage are out of phase from each other by a duration of 1H. At the time while G(L) and G(L+1) are high, the voltage at the A-node, which node controls pull down transistor Tr3, is low (see timing section P of FIG. 4). At all other times the A-node of shift register stage SR(L) is high and thus pull down transistor Tr3 is turned on. In other words, when the A-node is at the high level, the gate voltage output terminal Out pulled down to the low voltage Vss by action of the 3-rd transistor Tr3, such that the gate-on voltage cannot be outputted from the OUT(L) terminal. During a section where the gate-on voltage is outputted, the A-node should be at the low level. Before the gate-on voltage is generated, the gate voltage output terminal Out(L) is held at the low voltage Vss by action of the 3-rd transistor Tr3 to thereby prevent noise from being included in the corresponding gate line G(L). The A-node has the low level even during the 1H section after the 1H period in which the gate-on voltage has been outputted. This is done to prevent the gate voltage output terminal Out from being prematurely lowered to the low voltage by prematurely driving the Q-node low. Since the high gate-on voltage of the next stage (SR(k+1) see FIG. 3) is inputted through the second input terminal IN2, thus, the gate voltage output terminal Out is changed to the low voltage Vss by operation of the 2-nd transistor Tr2, such that the corresponding part may have the low level with this being done through the low gain signal path of Tr2 rather than through the higher gain signal path of the Q-node.

A reason why a part generating the output of the A-node is referred to as the inverter is that when the high signal is applied to the first clock terminal CK1 of the current stage, the gate-on voltage is outputted, but the A-node has the low level in the corresponding section, such that it is referred to as the inverter as described in FIG. 4.

Hereinafter, through FIG. 5, actual waveforms of a gate-on voltage in one stage and a voltage at the A-node will be described.

Figure 5:
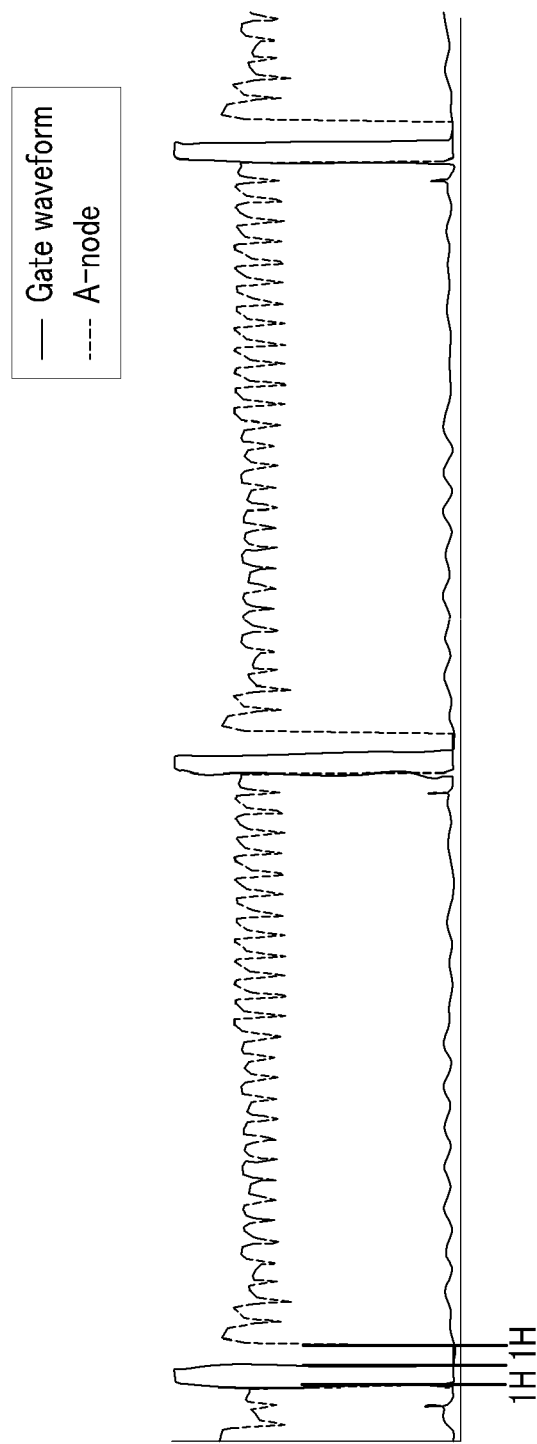
FIG. 5 is a second timing diagram showing waveforms expected to be found at the A-node as well as on the corresponding OUT terminal of the embodiment of FIG. 3.

FIG. 5 is a graph measuring an A-node voltage and a gate-line on voltage according to an embodiment of FIG. 3.

As shown in FIG. 5, the gate-line on voltage (solid line) is outputted for a 1H duration in every frame and the gate-on voltage has a voltage substantially corresponding to the low voltage Vss in spite of little changes therein the rest of the timing sections. Meanwhile, the voltage (dot line) of the A-node is high most of the time and has the low voltage Vss only during the 2H timing section wherein the gate-on voltage of the current stage is output for a 1H period and then the next successive stage (SR(k+1)) is turned on in the next 1H period, with the voltage of the A-node varying slightly within a predetermined voltage range every 1H (in synch with the rising edges of the CK1 and CK2 pulses) in the rest of the timing sections.

Since the inverter 512 is constituted by two sections 512-1 and 512-2 and operates by receiving two clock signals CKV and CKVB and two gate voltages (the gate voltage of the current stage and the gate voltage of the next stage), the voltage at the A-node has a voltage which varies every 1H. If only one of the two inverters 512-1,2 were used, the output of the A-node would instead vary (drop down by a short amount as it waits to be recharged) every 2H. But then the A-node variation would have lower frequency content which is harder to suppress with capacitors. As a result, due to the swing voltage range of the A-node, the voltage of the stage SR may be made to vary less extensively in relative proportion to the swing voltage range of the output terminal by increasing the frequency of its recharging pulses by using two inverters 512-1 and 512-2 rather than just one. Therefore, according to a teaching of the present disclosure, it is possible to better stabilize the voltages in each stage SR(k) by using two clock signals and two alternating A-node inverter circuits and to thus reduce noise even when operating at high temperatures.

Hereinafter, a gate driver according to another embodiment will be described with reference to FIGS. 6 and 7.

Figure 6A:
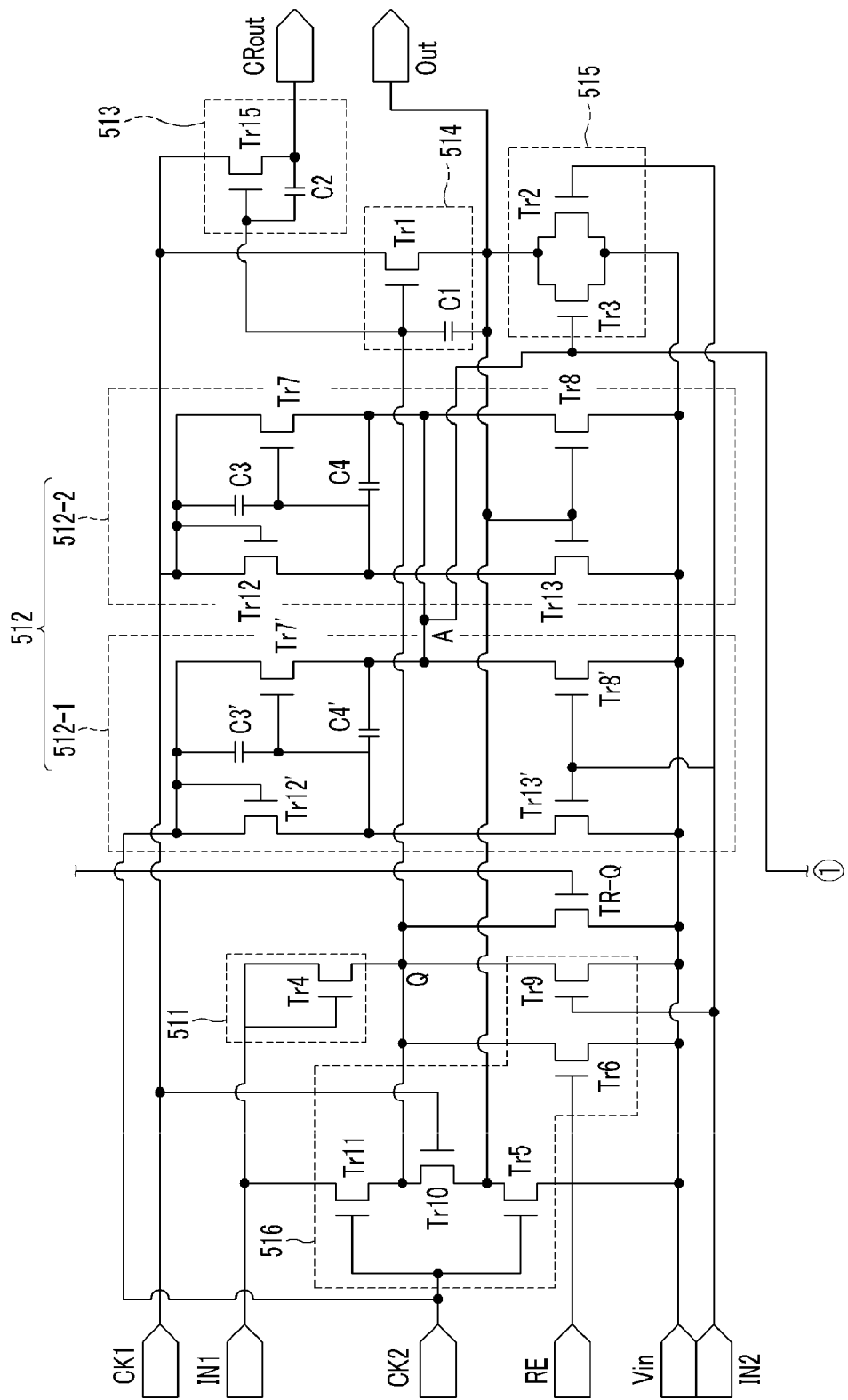
FIGS. 6A and 6B are combinable circuit diagrams of two interconnected stages SR adjacent to each other in the driver block of FIG. 2.
Figure 6B:
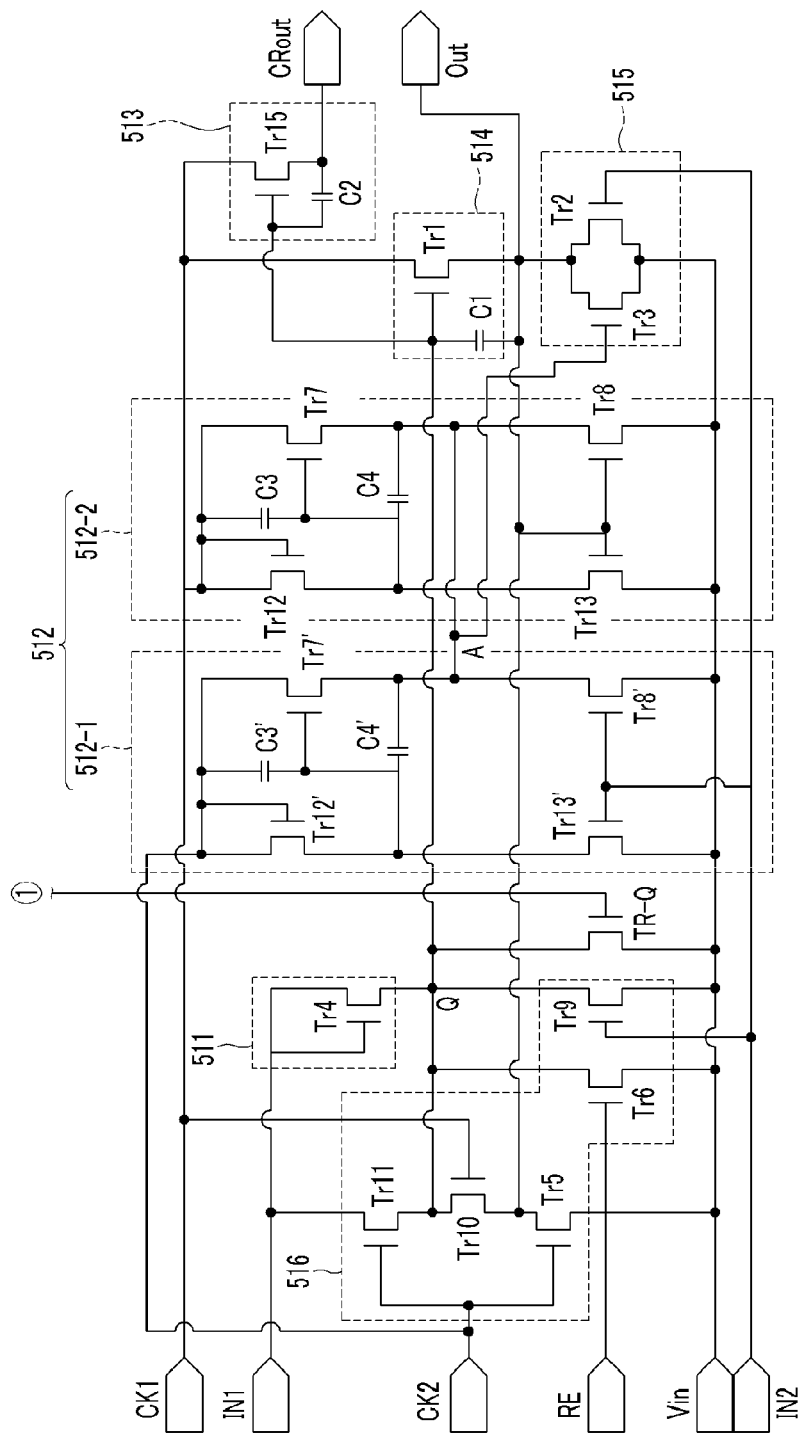

FIGS. 6A and 6B are enlarged and to be-combined circuit diagrams of two stages SR adjacent to each other and similar to that of FIG. 2 except that the A-node of one extends to the gate of an added transistor TR-Q in the next stage as shown.

More specifically, each shift register stage, for example SR(k) and SR(k+1) of respective FIGS. 6A and 6B further includes a so-called Q transistor, Tr-Q that is coupled so as to lower the voltage of the Q-node in the next stage SR(k+1) when the A-node in the current stage SR(k) is high.

Referring to FIGS. 6A and 6B, each stage SR of the gate driver 500 according to the exemplary embodiment includes an input unit 511, an inverter unit 512, a transfer signal generating unit 513, an output unit 514, and pull-down driving units 515 and 516, and a Q transistor Tr-Q. Although the Q transistor Tr-Q could be considered to be part of the pull-down driving units 515 and 516 in terms of one aspect of the operation of the Q transistor Tr-Q (de-activating TR-Q allows Tr1 to be turned on and thus allows the OUT(k) terminal to go high), the operation of the TR-Q transistor will separately be described in order to specifically describe a difference from FIG. 3.

Further, the input unit 511, the inverter 512, the transfer signal generating unit 513, the output unit 514, and pull-down driving units 515 and 516 have the same connection relationship as those of the embodiment of FIG. 3. Therefore, a repeated description thereof will be omitted.

The Q transistor Tr-Q which is a characteristic of the embodiment of FIGS. 6A and 6B will be described below. A control electrode of the Q transistor Tr-Q is connected with the A-node of the previous stage. (See line 1-1 connected between FIGS. 6A and 6B) Further, an input electrode of the Q transistor Tr-Q is connected with the Q-node of the current stage and an output electrode of the Q transistor Tr-Q is connected with the voltage input terminal Vin to receive the low voltage Vss. As a result, the Q transistor Tr-Q serves to change the voltage of the Q-node to the low voltage Vss when the A-node of the previous stage is at a high level. The characteristics of the Q-transistor Tr-Q will be described below with reference to FIG. 7.

Figure 7:
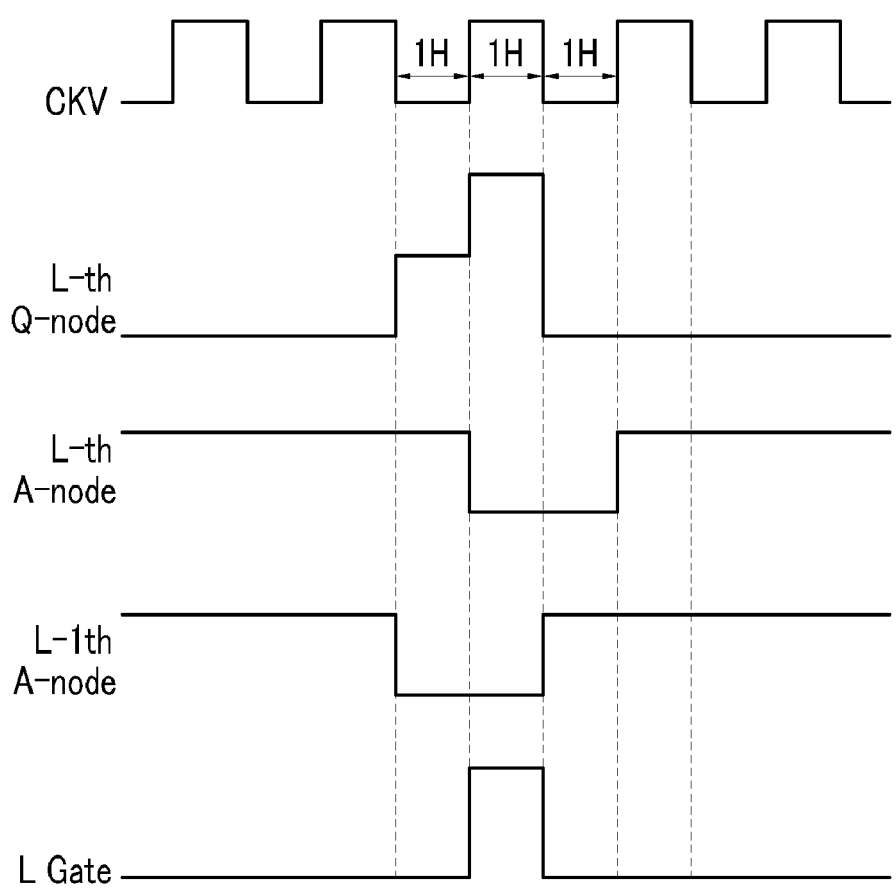
FIG. 7 is a timing diagram showing waveforms of a Q-node voltage, an A-node voltage, and an output gate voltage of a gate driver according to an embodiment of FIGS. 6A and 6B.

FIG. 7 is a timing diagram showing waveforms of the Q-node voltage, of the A-node voltage, and of the output gate line voltage of the gate driver according to an embodiment of FIGS. 6A and 6B.

First, the first clock signal CKV and the second clock signal CKVB have phases inverted to each other. In FIG. 7, only the first clock signal CKV is shown and the second clock signal is omitted. In addition, the gate-on voltage in the L-th (current) stage (herein, L represents an odd number) and the A-node voltage at the L-th (current) stage are the same as each other as shown in FIG. 4.

The Q transistor Tr-Q added in FIGS. 6A and 6B changes the voltage at the Q-node of the current stage (L) to the low voltage Vss when the A-node of the previous stage (L−1) is high. Therefore, the voltage at the Q-node needs to be described. For this reason, in FIG. 7, the voltage at the Q-node of the L-th (current) stage is also shown. In the case of the voltage at the Q-node of the L-th (current) stage, the voltage is first charged in the 1-st capacitor C1 for 1H (by the Carry pulse supplied via the IN1 terminal) before the gate turn on voltage level, VGon is outputted by the current stage (first charging). The Q-node voltage is boosted (by a second charging) and increases in magnitude for the next 1H, the gate-on voltage is outputted. The first charging and the second charging of the Q-node are important steps for assuring full output of the gate turn on voltage level, VGon in the time period indicated by the L Gate waveform. The voltage at the Q-node is reduced to the low voltage Vss in timing sections where the first charging and the second charging are not performed. Since preparation for the timing section of Gate L going high coincides with a low-voltage timing section of the A-node of the previous (L−1-th) stage shown in FIG. 7, the control terminal of the Q transistor Tr-Q is connected with the A-node of the previous stage to prevent the voltage at the Q-node from being lowered to the low voltage Vss while the first charging and the second charging take place.

A reason why the voltage at the Q-node is additionally controlled in FIGS. 6A and 6B to have two levels is because the noise generated at high temperature is due to a ripple in the voltage at the Q-node. Accordingly, in order to remove some of that noise particularly when operating at high temperatures, the Q-node is not rapidly charged to full potential in one step but rather in two steps.

Further, as described above, in the case of using the A-node of the previous stage, the 6-th transistor Tr6, the 9-th transistor Tr9, or the 11-th transistor Tr11 changing the voltage at the Q-node in two steps may be deleted.

The embodiment in FIGS. 6A and 6B also includes two inverters 512 like the embodiment in FIG. 3. As a result, the noise on the gate-on voltage is reduced at high temperature.

Hereinafter, a gate driver according to yet another embodiment will be described with reference to FIGS. 8 and 9.

Figure 8A:
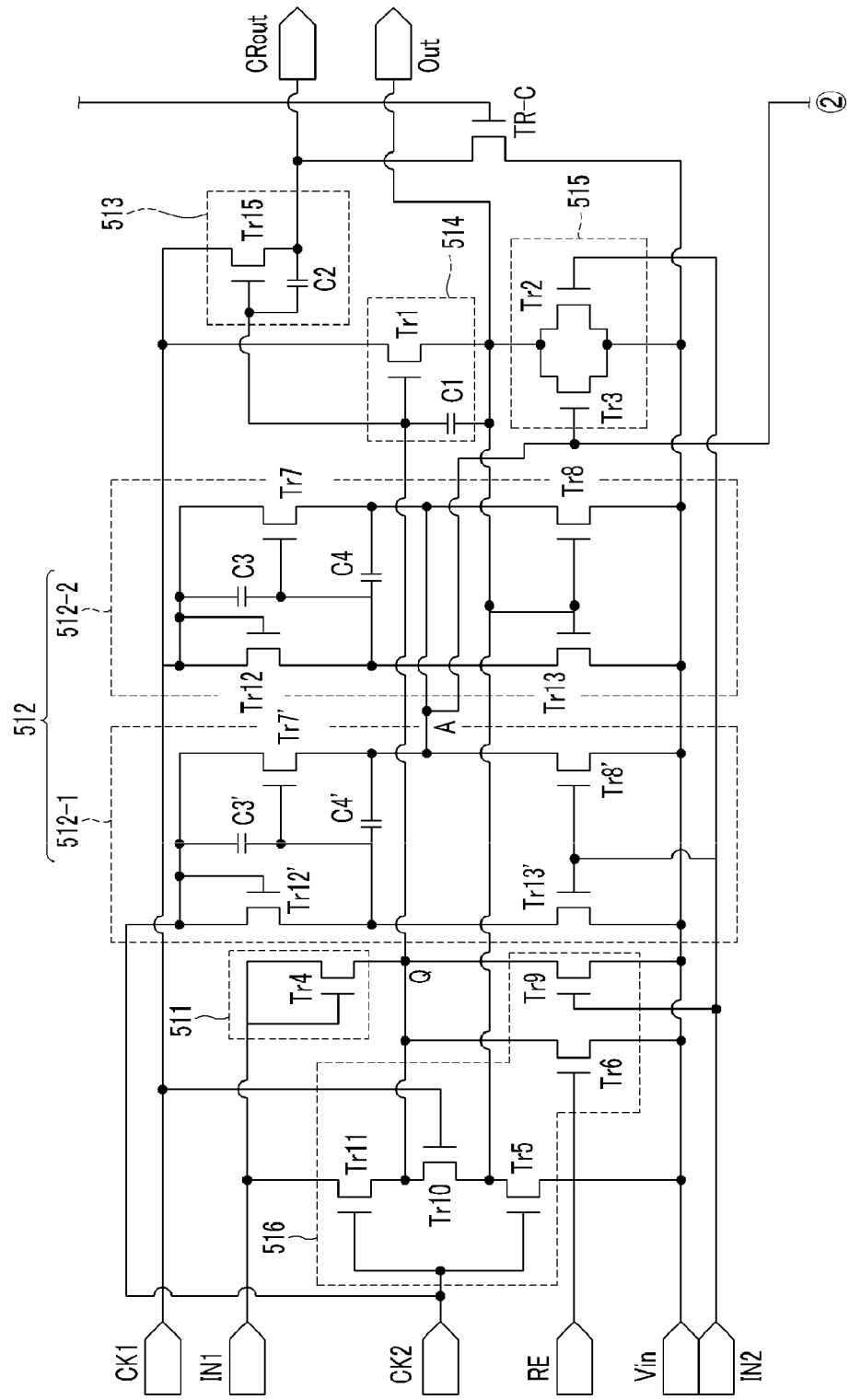
FIGS. 8A and 8B are combinable circuit diagrams of two interconnected stages SR adjacent to each other in the driver block of FIG. 2.
Figure 8B:
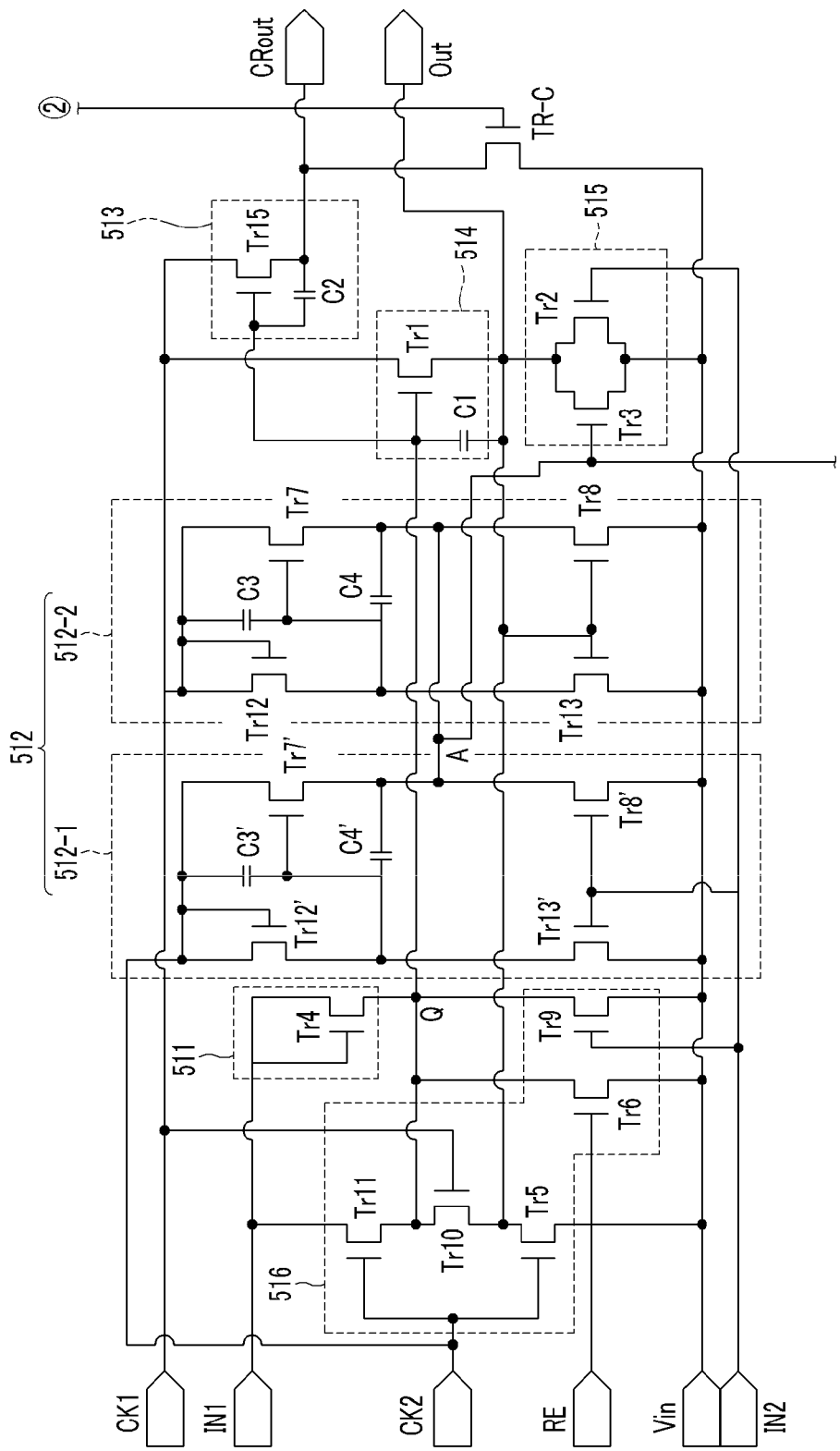

FIGS. 8A and 8B are enlarged circuit diagrams of two stages SR adjacent to and connected to each other within block 500 of FIG. 2.

FIGS. 8A and 8B further include a C transistor Tr-C changing the voltage of the transfer signal output terminal CRout to the low voltage Vss unlike the embodiment of FIG. 3. The C transistor Tr-C operates according to the previous A-node voltage. Meanwhile, FIGS. 8A and 8B are connected with each o through.

Referring to FIGS. 8A and 8B, each stage SR of the gate driver 500 according to the exemplary embodiment includes an input unit 511, an inverter unit 512, a transfer signal generating unit 513, an output unit 514, and pull-down driving units 515 and 516, and a C transistor Tr-C. The C transistor Tr-C changes the voltage of the transfer signal output terminal CRout. Therefore, the C transistor Tr-C operates differently from the pull-down driving units 515 and 516 of FIG. 3, but the C transistor Cr-C may be considered as included in the pull-down driving units 515 and 516 in aspect of lowering of the voltage. However, the C transistor Tr-C will be separately described in order to specifically describe the difference from FIG. 3.

Further, the input unit 511, the inverter 512, the transfer signal generating unit 513, the output unit 514, and pull-down driving units 515 and 516 have the same connection relationship as those of the embodiment of FIG. 3. Therefore, a description thereof will be omitted.

The C transistor Tr-C which is a characteristic of the embodiment of FIGS. 8A and 8B will be described below. A control electrode of the C transistor Tr-C is connected with the A-node of the previous stage. (See line 2-2 connected between FIGS. 8A and 8B) Further, an input electrode of the C transistor Tr-C is connected with the transfer signal output terminal CRout of the current stage and an output electrode of the C transistor Tr-C is connected with the voltage input terminal Vin to receive the low voltage Vss. As a result, the C transistor Tr-C serves to change the voltage of the transfer signal output terminal CRout is changed to the low voltage Vss when the A-node of the previous stage is at a high level. The characteristics of the C-transistor Tr-C will be described below with reference to FIG. 9.

Figure 9:
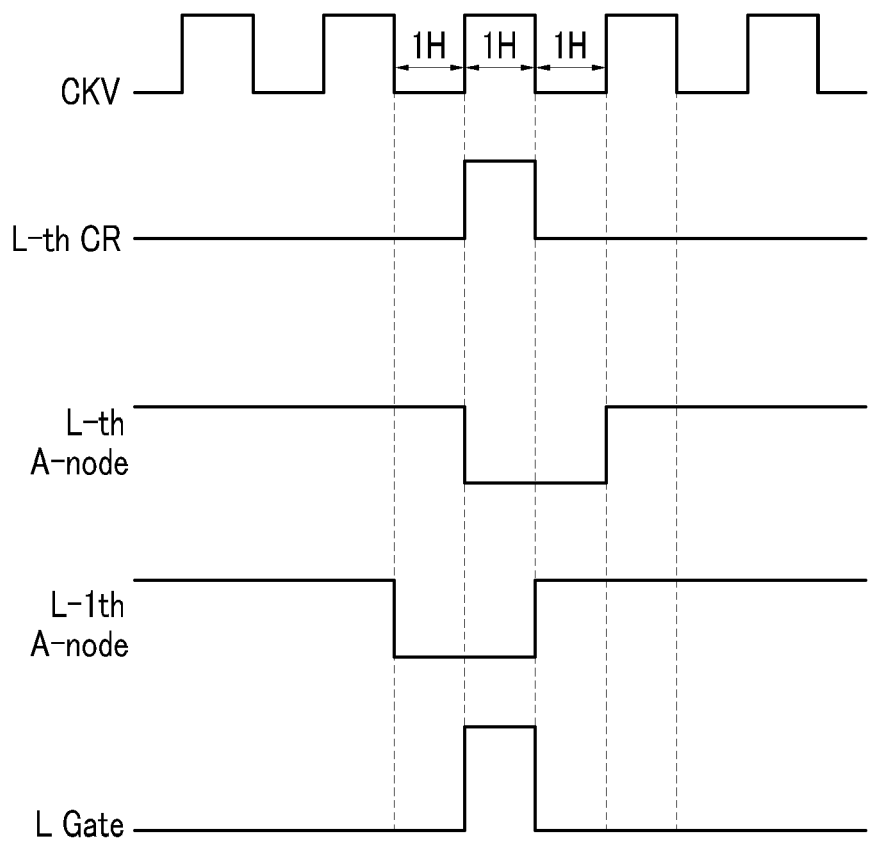
FIG. 9 is a graph showing waveforms of an A-node voltage, the voltage of a transfer signal CR, and an output gate voltage of gate driver according to an embodiment of FIGS. 8A and 8B.

FIG. 9 is a timing diagram showing waveforms of the A-node voltages in the current SR(L) stage and the previous SR(L-1) stage, the voltage of the transfer signal CR(L), and an output gate line voltage G(L) of a gate driver according to an embodiment of FIGS. 8A and 8B.

First, the first clock signal CKV and the second clock signal CKVB have phases inverted to each other. In FIG. 9, only the first clock signal CKV is shown and the second clock signal is omitted. In addition, the gate turn on voltage level, VGon in the L-th (current) stage (herein, L represents the odd number) and the A-node voltage in the L-th (current) stage are the same as each other as shown in FIG. 4. The voltage at the A-node voltage in the L-1-th (previous) stage is the same as that shown in FIG. 7. In FIG. 9, the voltage of the transfer signal CR in the L-th (current) stage is additionally shown. The voltage of the transfer signal CR(L) has substantially the same waveform as the gate turn on voltage level, VGon in the L-th (current) stage.

One of the reasons why the noise is generated when the gate driver 500 is driven at high temperature is that the noise is applied to the first input terminal IN1 of the next stage through the transfer signal CR from a previous stage due to noise included in the transfer signal CR. Therefore, in the embodiment of FIGS. 8A and 8B, the noise is prevented from being included in the transfer signal CR that is passed like a baton or token from stage to stage.

Since the transfer signal CR is inputted into the first input terminal IN1 of the next stage, the C transistor Tr-C should not operate (should not be turned on) during a timing section where the high transfer signal CR is outputted. Therefore, the C transistor Tr-C does not operate during only the timing section where the transfer signal CR is outputted and may be turned on in the rest sections. However, in the embodiment of FIGS. 8A and 8B, since there is no signal having the low level only in the 1H section of one frame, the C transistor Tr-C is controlled based on the voltage at the A-node of the previous stage instead.

At this time, a reason why the voltage at the A-node controlling the C transistor Tr-C uses the voltage at the A-node of the previous stage, not the voltage at the A-node of the current stage will be described below.

That is, since noise generated before the voltage of the transfer signal CR is changed to the high level shows a pre-charge property for raising the transfer signal CR, the noise is a problem, but since noise generated after the voltage of the transfer signal CR is changed to the high level cannot be alleviated, the noise is recognized as noise as it is. Therefore, it is possible to acquire driving stability at higher operating temperatures by lowering the voltage of the transfer signal output terminal CRout to the low voltage Vss after the voltage of the transfer signal CR is changed to the high level by using the voltage at the A-node of the previous stage.

Meanwhile, in some embodiments, an additional signal is supplied so as to prevent the C transistor Tr-C from operating only in the 1H timing section where the transfer signal CR is outputted.

The embodiment in FIGS. 8A and 8B also includes two inverters 512 like the embodiment in FIG. 3. As a result, the noise on the gate-on voltage is reduced at high temperature.

Hereinafter, a gate driver according to yet another embodiment will be described with reference to FIG. 10.

Figure 10A:
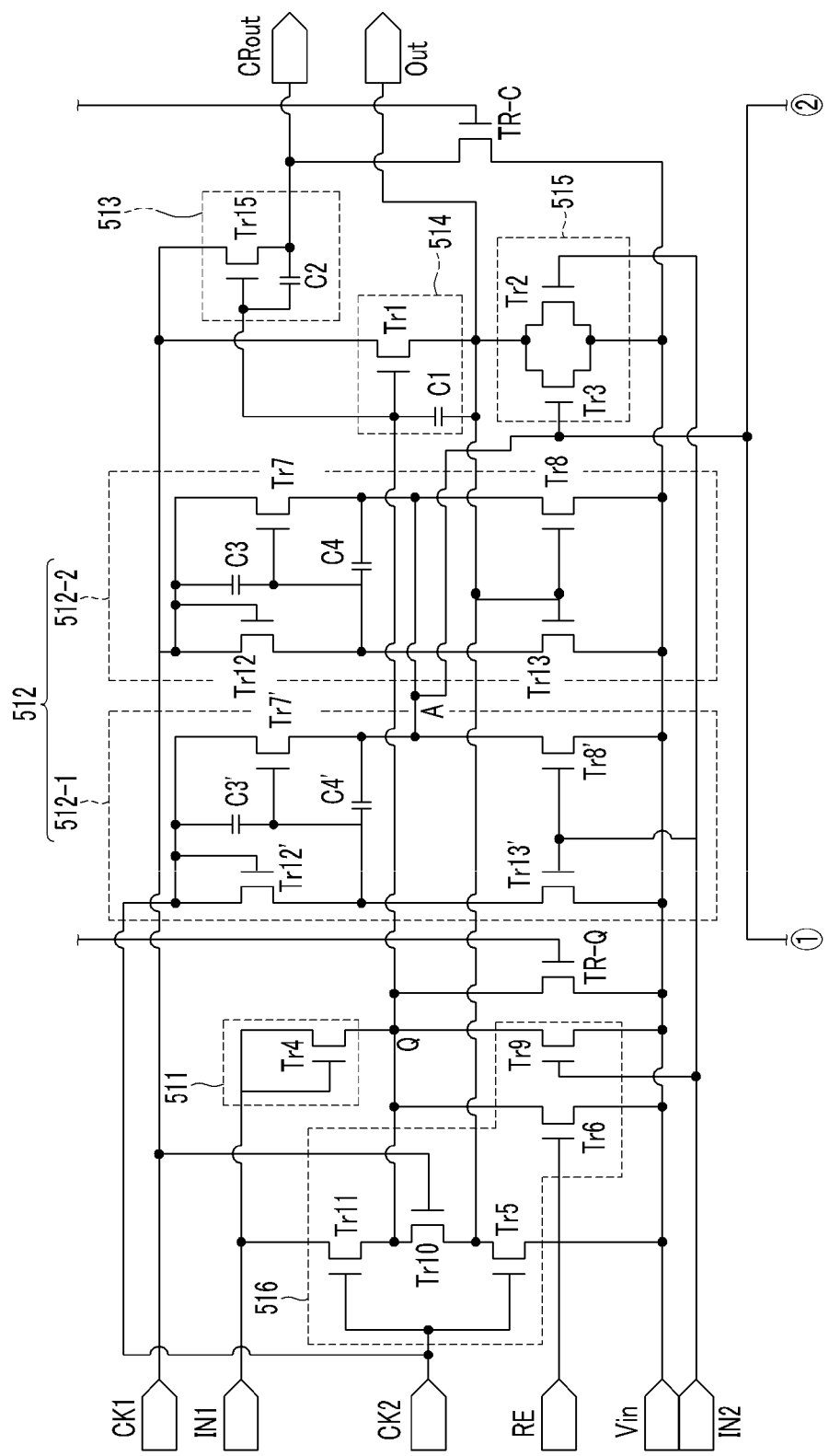
FIGS. 10A and 10B are combinable circuit diagrams of two interconnected stages SR adjacent to each other in the driver block of FIG. 2.
Figure 10B:
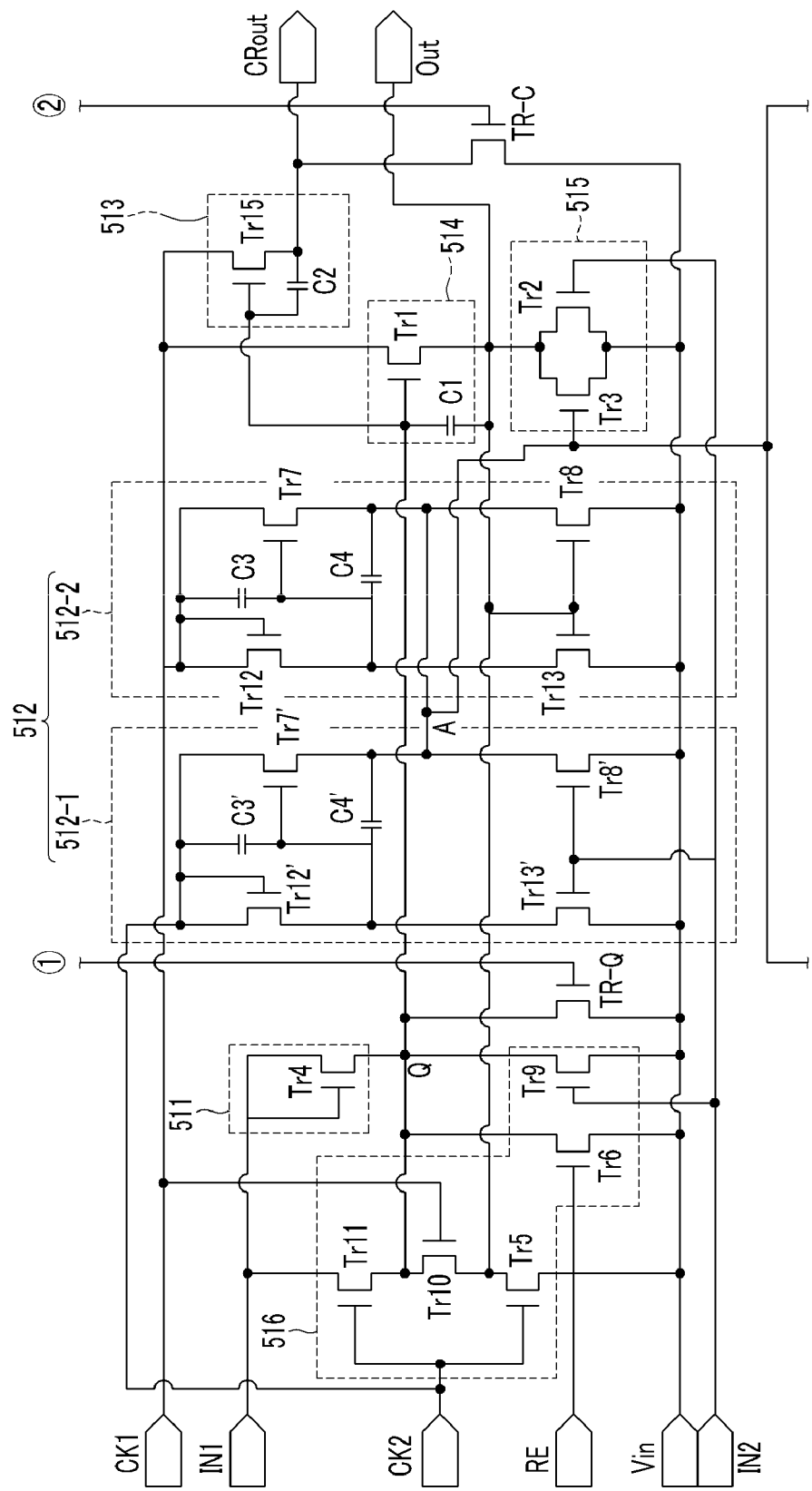

FIGS. 10A and 10B are enlarged circuit diagrams of two stages SR adjacent to each other of FIG. 2.

The embodiment of FIGS. 10A and 10B includes all the characteristics of FIGS. 3, 6A, 6B, 8A, and 8B.

That is, two inverters 512-1 and 512-2 are used as shown in FIG. 3 and the Q transistor Tr-Q changing the voltage at the Q-node to the low voltage Vss is included as shown in FIGS. 6A and 6B, and the C transistor Tr-C changing the voltage of the transfer signal output terminal CRout to the low voltage Vss is also included as shown in FIGS. 8A and 8B.

As a result, it is possible to stabilize the voltage of the stage SR by using two inverters using two clock signals and two gate voltages, reduce noise even at high temperature, and easily change the voltage at the Q-node to the low voltage Vss. Further, it is possible to reduce the noise at high temperature by preventing the noise from being included in the transfer signal CR. In addition, according to an embodiment, the 6-th transistor Tr6, the 9-th transistor Tr9, or the 11-th transistor Tr11 may be deleted.

While this disclosure of invention has been described in connection with exemplary embodiments, it is to be understood that the present teachings are not limited to the disclosed embodiments, but, on the contrary, is intended that these teachings cover various modifications and equivalent arrangements included within the spirit and scope of the present teachings.

What is claimed is:

1. A display device comprising:
   a display area that includes a plurality of elongated gate lines; and
   a gate lines driver block that is connected to respective first ends of the elongated gate lines and includes a plurality of stages each configured to provide a gate voltage to a respective one of the gate lines,
   wherein a current stage among the stages includes a first inverter that is configured to operate in synchronism with a first clock signal supplied to the current stage,
   wherein the current stage further includes a second inverter that is configured to operate in synchronism with a second clock signal supplied to the current stage,
   wherein a phase of the second clock signal is opposite to a phase of the first clock signal,
   wherein the second inverter receives a gate voltage of a next stage that is also provided to a gate line of the plurality of elongated gate lines,
   wherein the first inverter receives a gate voltage of the current stage,
   wherein the current stage further includes an outputting circuit configured to output a gate voltage having at least one of a predetermined gate turn on voltage level (VGon) and a predetermined gate turn off voltage level (VGoff) in accordance with a controlled node that is controlled by both the first inverter and the second inverter,
   wherein the first inverter includes a first transistor, a second transistor, a third transistor, and a fourth transistor, and the second inverter includes a fifth transistor, a sixth transistor, a seventh transistor, and an eighth transistor, wherein a control terminal of the first transistor and an input terminal of the first transistor receive the first clock signal, and an output terminal of the first transistor is connected to an input terminal of the second transistor, wherein a control terminal of the second transistor receives the gate voltage of the current stage, and an output terminal of the second transistor receives a low voltage, wherein a control terminal of the third transistor is connected to the output terminal of the first transistor, an input terminal of the third transistor receives the first clock signal or the second clock signal, and an output terminal of the third transistor is connected to an input terminal of the fourth transistor, wherein a control terminal of the fifth transistor and an input terminal of the fifth transistor receive the second clock signal, and an output terminal of the fifth transistor is connected to an input terminal of the sixth transistor, wherein a control terminal of the sixth transistor receives the gate voltage of the next stage, and an output terminal of the sixth transistor receives the low voltage, and wherein an input terminal of the seventh transistor is connected to the input terminal of the fifth transistor, and an output terminal of the seventh transistor is connected to an input terminal of the eighth transistor.

2. The display device of claim 1, wherein:
the gate voltage of the current stage is changed to a low voltage depending on an output of the first inverter and an output of the second inverter.

3. The display device of claim 2, wherein:
the current stage operates by receiving the low voltage, a transfer signal of a previous stage, and a gate voltage of a next stage.

4. The display device of claim 3, wherein:
the current stage further includes an input unit, a pull-down driving unit, an output unit, and a transfer signal generating unit.

5. The display device of claim 4, wherein:
the output unit and the transfer signal generating unit output a gate-on voltage and a transfer signal, respectively depending on a voltage at a first node.

6. The display device of claim 5, wherein:
the pull-down driving unit changes the voltage at the first node or the gate voltage of the current stage to the low voltage.

7. The display device of claim 6, wherein:
the output of the first inverter and the output of the second inverter are connected to each other at a second node.

8. The display device of claim 7, wherein:
the first inverter applies a high signal to the second node when a high level is supplied to the first clock signal and changes the voltage at the second node to the low voltage when a gate-on voltage of the next stage is supplied and the second inverter applies the high signal to the second node when the high level is supplied to the second clock signal and changes the voltage at the second point to the low voltage when a gate-on voltage of the current stage is supplied.

9. The display device of claim 8, wherein:
the voltage at the second node has a low level during only a section where the gate-on voltage, in which the gate voltage of the current stage is at a high level, is applied and a next 1H section.

10. The display device of claim 1, wherein:
the gate voltage of the current stage is changed to the low voltage depending on an output of the first inverter and an output of the second inverter.

11. The display device of claim 1, wherein:
the current stage further includes the input unit, the pull-down driving unit, the output unit, and the transfer signal generating unit.

12. The display device of claim 11, wherein:
the output unit and the transfer signal generating unit output the gate-on voltage and the transfer signal, respectively depending on the voltage at the first node.

13. The display device of claim 12, wherein:
the pull-down driving unit changes the voltage at the first node or the gate voltage of the current stage to the low voltage.

14. The display device of claim 13, wherein:
the output of the first inverter and the output of the second inverter are connected to each other at the second point.

15. The display device of claim 14, wherein:
the first inverter applies the high signal to the second node when the high level is applied to the first clock signal and changes the voltage at the second node to the low voltage when the gate-on voltage of the next stage is applied and the second inverter applies the high signal to the second node when the high level is applied to the second clock signal and changes the voltage at the second point to the low voltage when the gate-on voltage of the current stage is applied.

16. The display device of claim 15, wherein:
the voltage at the second node has the low level during only the section where the gate-on voltage, in which the gate voltage of the current stage is at a high level, is applied and the next 1H section.

* * * * *